(12) United States Patent
Yang et al.

(10) Patent No.: US 11,210,915 B2
(45) Date of Patent: Dec. 28, 2021

(54) ITEM LOCATION TRACKING DEVICE HAVING ANTI-THEFT FUNCTION

(71) Applicant: AMOSENSE CO., LTD., Cheonan-si (KR)

(72) Inventors: Jin Sung Yang, Seoul (KR); Byeong An Yu, Gwangmyeong-si (KR); Sang Yeoll Lee, Seoul (KR)

(73) Assignee: Amosense Co., Ltd., Cheonan-si (KR)

( * ) Notice: Subject to any disclaimer, the term of this patent is extended or adjusted under 35 U.S.C. 154(b) by 0 days.

(21) Appl. No.: 16/971,824

(22) PCT Filed: Feb. 28, 2019

(86) PCT No.: PCT/KR2019/002417
§ 371 (c)(1),
(2) Date: Aug. 21, 2020

(87) PCT Pub. No.: WO2019/168369
PCT Pub. Date: Sep. 6, 2019

(65) Prior Publication Data
US 2020/0388126 A1    Dec. 10, 2020

(30) Foreign Application Priority Data

Feb. 28, 2018  (KR) .................. 10-2018-0024786
Feb. 28, 2019  (KR) .................. 10-2019-0023789

(51) Int. Cl.
*G08B 13/24*  (2006.01)
*G08B 3/10*   (2006.01)

(52) U.S. Cl.
CPC .......... *G08B 13/2462* (2013.01); *G08B 3/10* (2013.01); *G08B 13/2434* (2013.01); *G08B 13/2442* (2013.01)

(58) Field of Classification Search
CPC .. G08B 13/2462; G08B 3/10; G08B 13/2434; G08B 13/2442; G08B 13/149; G01R 33/02
(Continued)

(56) References Cited

U.S. PATENT DOCUMENTS 7,281,397 B2 * 10/2007 Victor ..................... E05B 73/00
                                                            42/70.01
9,773,601 B2 *  9/2017 Breiwa ............. F16M 11/2078

FOREIGN PATENT DOCUMENTS

CN    202694493 U    1/2013
JP    H0618029  A    1/1994
(Continued)

OTHER PUBLICATIONS

International Search Report cited in PCT/KR2019/002417 dated Jun. 20, 2019, 2 pages.
(Continued)

*Primary Examiner* — John A Tweel, Jr.
(74) *Attorney, Agent, or Firm* — Rothwell, Figg, Ernst & Manbeck, P.C.

(57) ABSTRACT

An item location tracking device having anti-theft function is provided. An item location tracking device having anti-theft function according to one embodiment of the present invention comprises: a tracker body comprising a sensing part and a communication module for transmitting information acquired through the sensing part to the outside, the sensing part including a magnetic force detecting sensor for detecting a magnetic field, and at least one state detecting sensor for detecting state information of an item; a container-shaped bracket having an insertion space into which the tracker body is inserted, and fixedly installed to an item so that the tracker body can be fixed to the item; and a permanent magnet disposed in the insertion space so that a magnetic field for detecting whether the tracker body and the
(Continued)

bracket are separated from each other can be provided toward the magnetic force detecting sensor.

15 Claims, 19 Drawing Sheets

(58) Field of Classification Search
 USPC .................................................. 340/572.8
 See application file for complete search history.

(56) References Cited

FOREIGN PATENT DOCUMENTS

| JP | 06-119573 A | 4/1994 |
|----|----|----|
| JP | H1198573 A | 4/1994 |
| JP | H06111153 A | 4/1994 |
| JP | 2002109646 A | 4/2002 |
| KR | 20-0217085 Y1 | 3/2001 |
| KR | 10-2010-0104727 A | 9/2010 |
| KR | 10-2011-0016176 A | 2/2011 |
| KR | 20-0463938 Y1 | 12/2012 |
| KR | 10-2017-0069019 A | 6/2017 |

OTHER PUBLICATIONS

Office Action in Indian application No. 202027030808, dated Jul. 26, 2021, 5 pages.

* cited by examiner

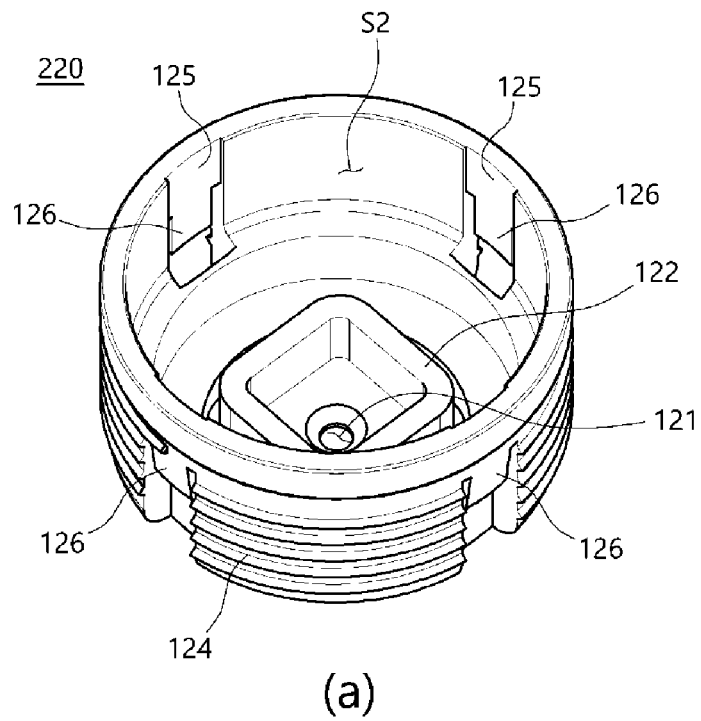
(a)
FIG. 9
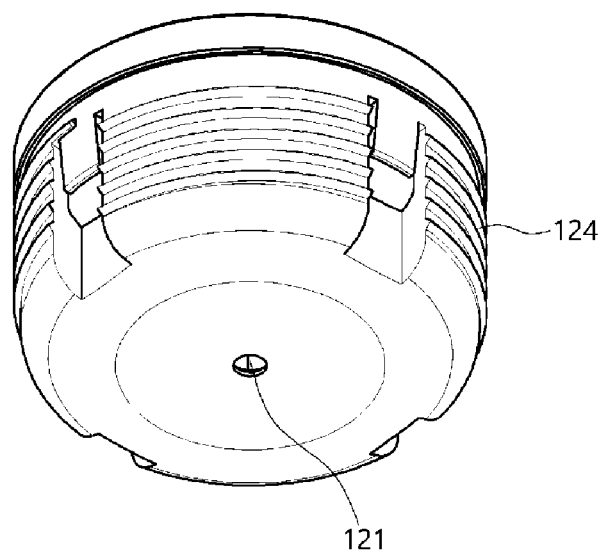
(b)

ITEM LOCATION TRACKING DEVICE HAVING ANTI-THEFT FUNCTION

CROSS REFERENCE TO RELATED APPLICATION

This application is a 35 U.S.C. 371 National Phase Entry Application from PCT/KR2019/002417, filed Feb. 28, 2019, which claims the benefit of Korean Patent Application No. 10-2018-0024786 filed on Feb. 28, 2018 and Korean Patent Application No. 10-2019-0023789 filed on Feb. 28, 2019, the disclosures of which are incorporated herein in their entireties by reference.

TECHNICAL FIELD

The present invention relates to an item location tracking device having an anti-theft function.

BACKGROUND ART

A tracking device is a device installed in an item and configured to periodically inform a user of a situation such as an external shock when the situation occurs.

A conventional tracking device is installed using a method in which a hole is formed in a particular item, for example, a pallet, and then the tracking device is inserted into the hole and the hole is filled with silicone or the device is installed using a method in which the device is attached to one side of a pallet through an adhesive and is covered with a cover to be prevented from being externally exposed.

However, the conventional tracking device may periodically transmit only information on a location of an item but may not provide alarm information to prevent the tracking device installed on the item from being stolen or illegally detached.

Accordingly, the conventional tracking device has a risk of being stolen and it is impossible to know a theft occurrence time even when a theft occurs. In addition, when the tracking device is separated or removed from the item, it is impossible to perform a fundamental function of the tracking device to control the item.

DISCLOSURE

Technical Problem

The present invention is directed to providing an item location tracking device having an anti-theft function that allows checking of whether the item location tracking device is stolen as well as preventing the item location tracking device from being stolen.

Technical Solution

One aspect of the present invention provides an item location tracking device having an anti-theft function. The item location tracking device includes a tracker body including a sensing portion including a magnetic force sensor configured to detect a magnetic field and at least one condition sensor configured to detect condition information of an item and a communication module configured to externally transmit information obtained using the sensing portion, a housing-shaped bracket which has an insertion space, into which the tracker body is inserted, and is fixedly installed on the item to fix the tracker body to the item, and a permanent magnet disposed in the insertion space to provide a magnetic field toward the magnetic force sensor to detect whether the tracker body is separated from the bracket.

When separation information between the tracker body and the bracket is sensed by the magnetic force sensor, the communication module may externally transmit the separation information.

The tracker body may further include an alarm portion configured to generate an alarm sound when the separation information between the tracker body and the bracket is sensed by the magnetic force sensor.

The condition information of the item may include one or more of position information of the item, information on whether an external shock is applied to the item, and temperature information, humidity information, and atmospheric pressure information of surroundings of the item.

The tracker body may include a lower cover which has an accommodation space with an open top and is detachably coupled to the bracket, at least one circuit board on which the sensing portion and the communication module are mounted and which is disposed in the accommodation space, a battery disposed in the accommodation space and electrically connected to the circuit board, an upper cover configured to cover the open top of the lower cover, and a control portion configured to control overall operations of the tracker body.

The bracket may include a plurality of guide grooves formed to be recessed from an inner surface along a height direction to allow an exclusive separation tool to enter.

At least a portion of each of the plurality of guide grooves may be cut to be elastically deformed by a pressure generated when the exclusive separation tool enters.

The tracker body may include a holding groove formed to be recessed along a circumferential direction so that one side of the exclusive separation tool is held.

The item may include a mounting hole to fasten the bracket. The bracket may include at least one protruding portion formed on an outer surface to protrude outward therefrom. The bracket may be inserted into and embedded in the mounting hole to be prevented, by the at least one protruding portion, from being externally separated.

The item may include a mounting hole to fasten the bracket, and the bracket and the mounting hole may be screw-coupled using mutually corresponding screw portions.

The bracket may include a mounting groove configured to accommodate the permanent magnet, and the mounting groove may be defined by a guide portion formed to protrude from a bottom surface of the insertion space.

In the bracket, at least one fastening hole for double fixation with the item may be formed to pass through a bottom surface of the insertion space.

When a magnetic force of the permanent magnet is sensed by the magnetic force sensor while the tracker body is coupled to the bracket, power may be supplied to the tracker body to drive the tracker body.

Advantageous Effects

According to the present invention, since a theft is prevented by transmitting information on a theft situation and generating an alarm sound, an item can be safely and reliably administrated even from a remote location.

DESCRIPTION OF DRAWINGS

FIG. 9(a) and FIG. 9(b) depict a bracket of FIG. 7 when viewed from above and below;

MODES OF THE INVENTION

Figure 1:
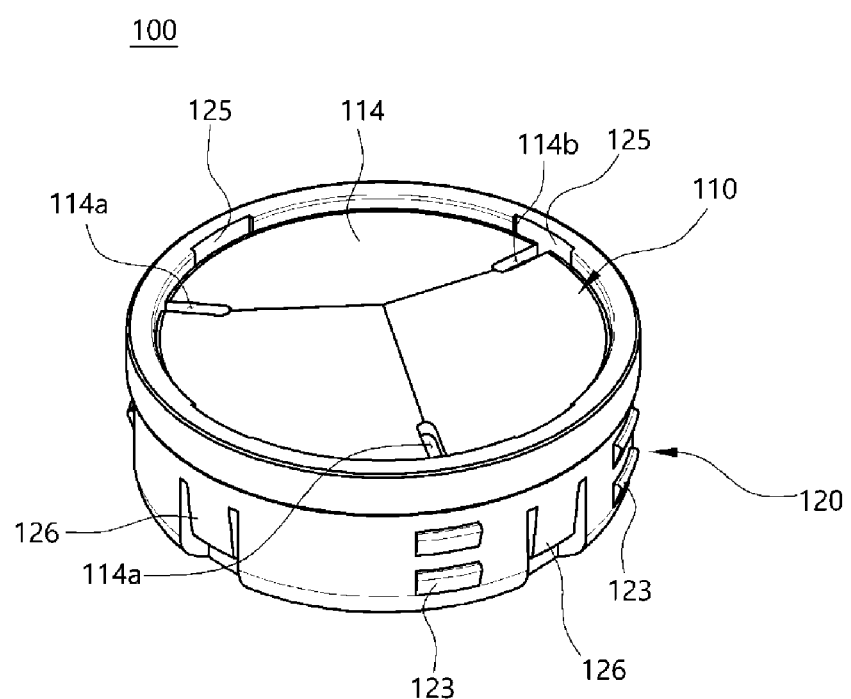
FIG. 1 is a schematic diagram of an item location tracking device having an anti-theft function according to one embodiment of the present invention.

Hereinafter, embodiments of the present invention will be described in detail to be implemented by one of ordinary skill in the art with reference to the drawings. The present invention may be implemented in a variety of shapes and will not be limited to the embodiments described herein. To clearly describe the present invention, description of an irrelevant part will be omitted. Throughout the specification, like or similar components will be referred to with like reference numerals.

Figure 7:
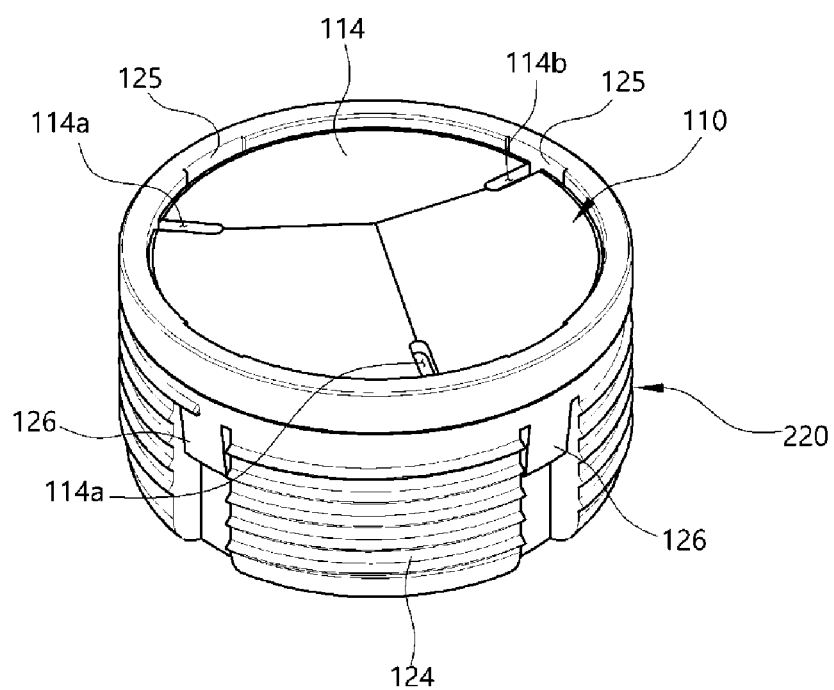
FIG. 7 is a schematic diagram of an item location tracking device having an anti-theft function according to another embodiment of the present invention.
Figure 10:
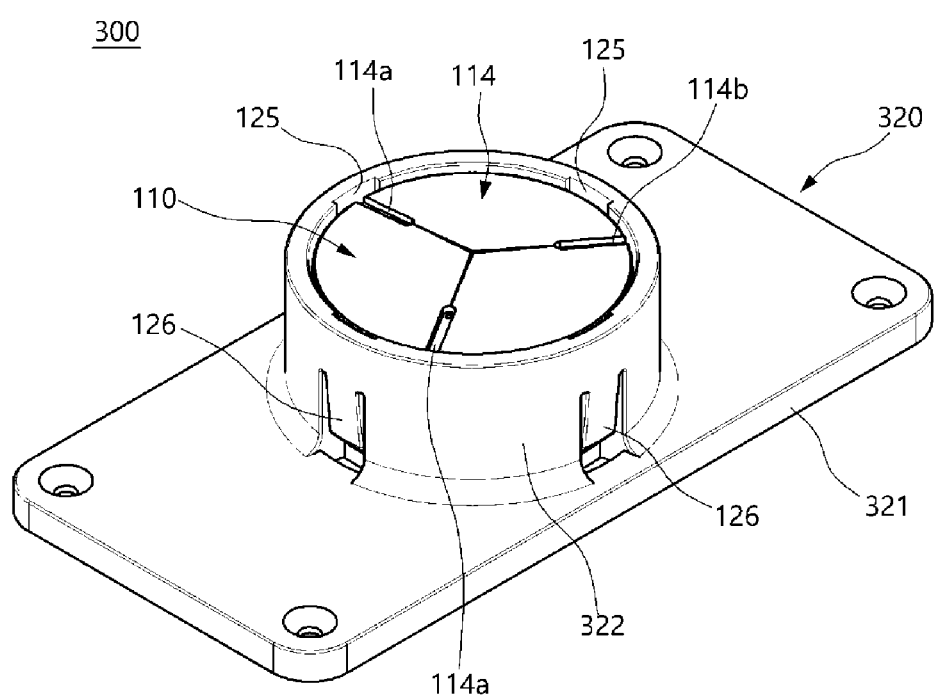
FIG. 10 is a schematic diagram of an item location tracking device having an anti-theft function according to still another embodiment of the present invention.

An item location tracking device 100, 200, or 300 having an anti-theft function according to one embodiment of the present invention includes a tracker body 110, a bracket 120, 220, or 320, and a permanent magnet 130 as shown in FIG. 1, 7, or 10.

In a state in which the bracket 120, 220, or 320 is fixedly installed on one side of an item 10, the tracker body 110 and the permanent magnet 130 are accommodated in the bracket 120, 220, or 320 such that the item location tracking device 100, 200, or 300 may be fixedly installed in the item 10.

Here, the tracker body 110 may include at least one condition sensor. Accordingly, the tracker body 110 may acquire a variety of pieces of information on the item 10 and surroundings thereof through the at least one condition sensor in a state in which the tracker body 110 is fixedly installed in the item 10 through the bracket 120, 220, or 320.

Also, when the tracker body 110 is separated from the bracket 120, 220, or 320, the item location tracking device 100, 200, or 300 may sense the separation, generate separation information, and transmit the generated separation information to the outside.

That is, when the tracker body 110 is stolen or forcibly separated from the bracket 120, 220, or 320, the item location tracking device 100, 200, or 320 may notify information thereon to a user or administrator.

Accordingly, the item location tracking device 100, 200, or 300 may monitor a current condition of the item 10 and continuously control the item 10 by preventing the tracker body 110 from being stolen and maintaining a state of being consistently installed in the item 10 to be controlled.

To this end, the tracker body 110 may include a magnetic force sensor 116a configured to sense separation from the bracket 120, 220, or 320 and may include a communication module 117 configured to externally transmit separation information obtained using the magnetic force sensor 116a.

Figure 2:
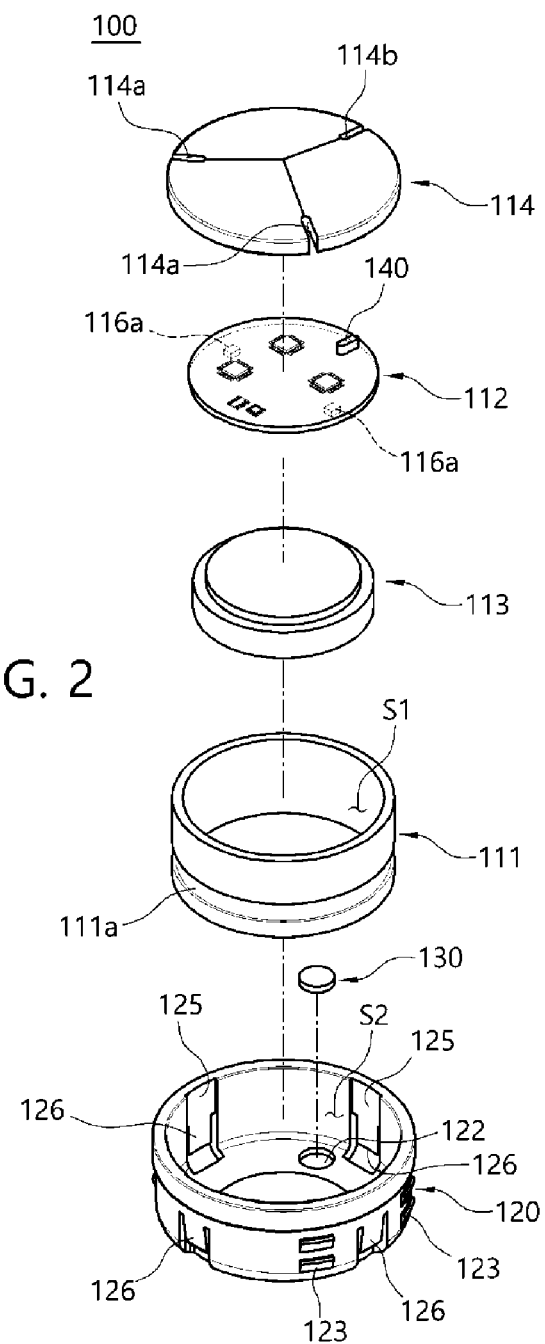
FIG. 2 is an exploded view of the item location tracking device of FIG. 1.
Figure 8:
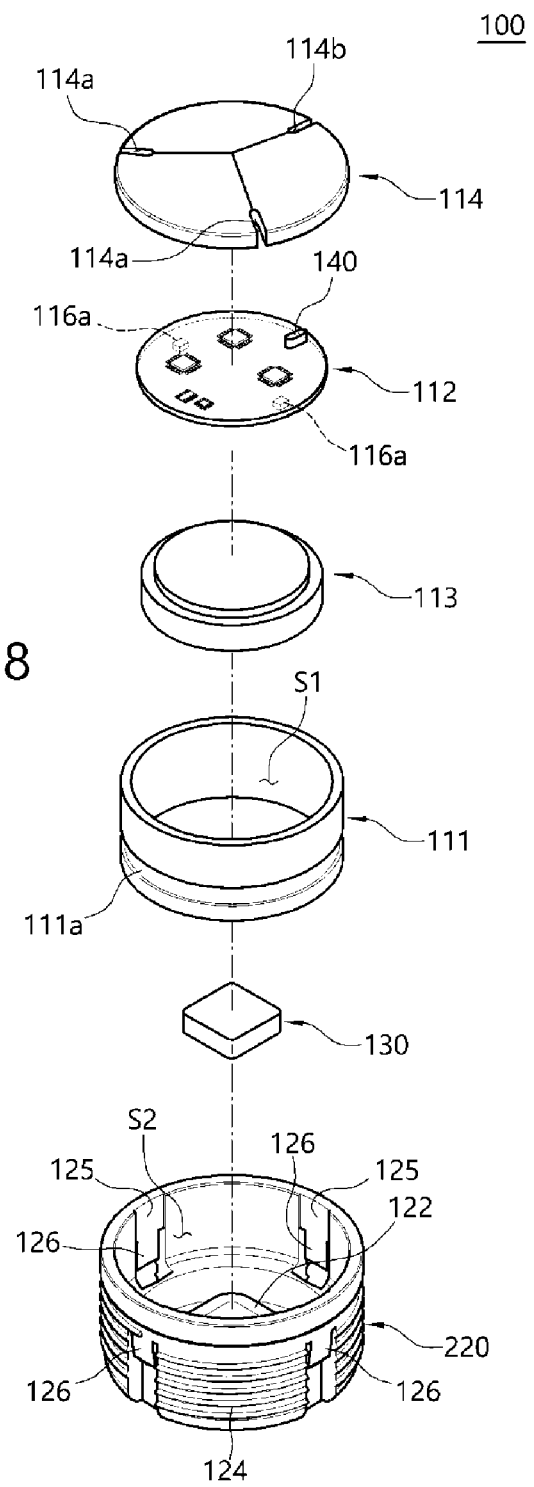
FIG. 8 is an exploded view of the item location tracking device of FIG. 7.
Figure 11:
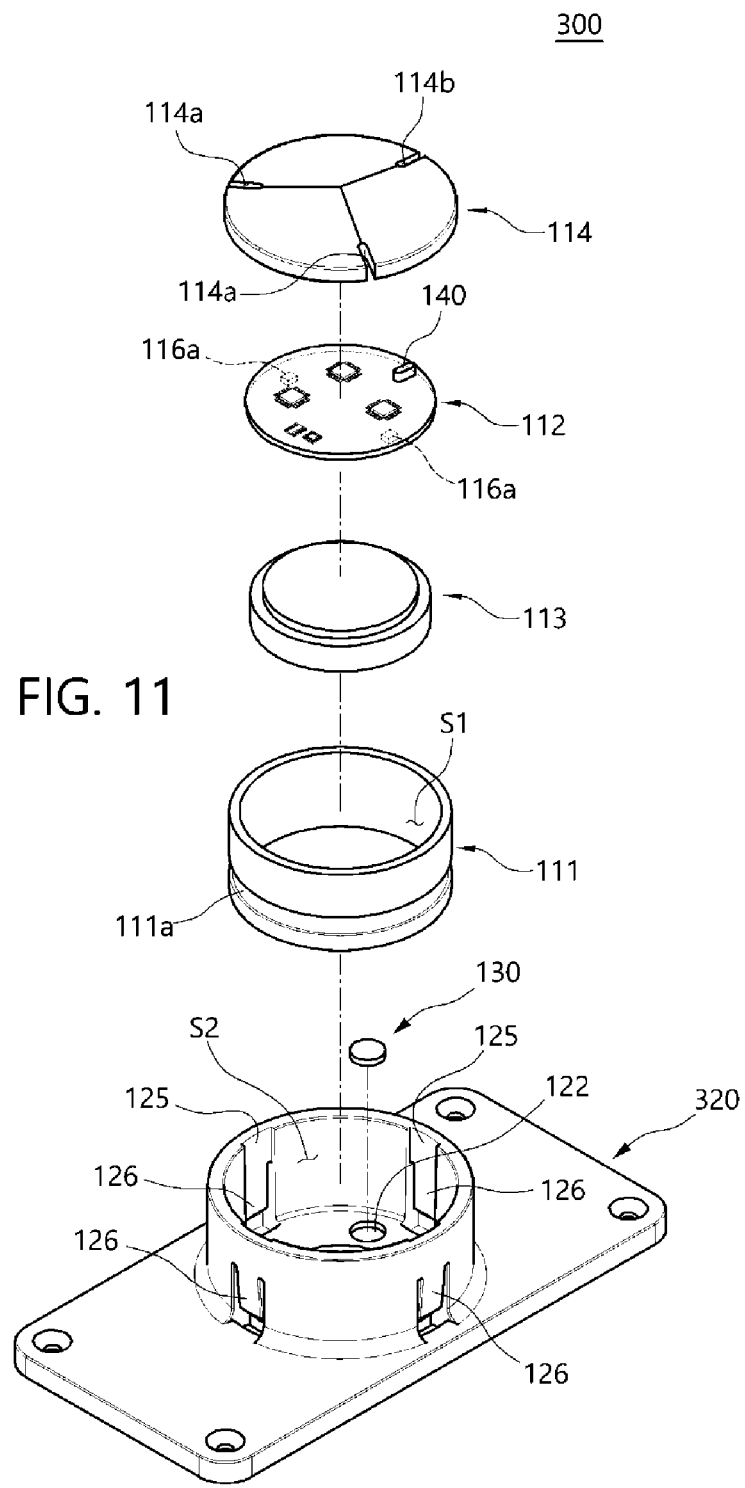
FIG. 11 is an exploded view of the item location tracking device of FIG. 10.

Also, the bracket 120, 220, or 320 may be provided with a housing shape having an insertion space S2 to accommodate the permanent magnet 130 and the tracker body 110 as shown in FIGS. 2, 8, and 11.

Here, the tracker body 110 may be inserted into the insertion space S2 to be located above the permanent magnet 130. Accordingly, when the tracker body 110 is fastened to the bracket 120, 220, or 320, the magnetic force sensor 116a may detect a magnetic field generated by the permanent magnet 130.

Accordingly, when the item location tracking device 100, 200, or 300 is normally installed on one side of the item 10 to be controlled, the tracker body 110 may perform all of detecting a magnetic field using the magnetic force sensor 116a, obtaining a variety of pieces of information on the item 10 and surroundings of the item 10 using the condition sensor, and externally transmitting the obtained information using the communication module 117.

In the above state, when the tracker body 110 is separated from the bracket 120, 220, or 320, the magnetic force sensor 116a may not detect a magnetic field generated by the permanent magnet 130 or may detect a very small magnetic field.

Figure 4:
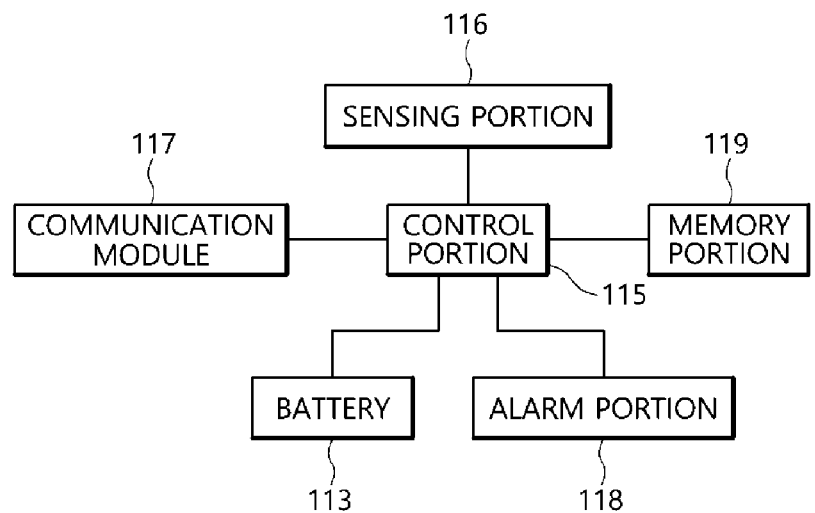
FIG. 4 is a block diagram illustrating main components of the item location tracking device having the anti-theft function according to the present invention.

In this case, as shown in FIG. 4, the communication module 117 may externally transmit information on the magnetic field sensed by the magnetic force sensor 116a by driving a control portion 115 included in the tracker body 110.

Accordingly, the user or administrator may recognize a state in which the tracker body 110 is stolen or unintentionally separated from the bracket 120, 220, or 320 on the basis of the information received from the communication module 117. Accordingly, the user or administrator may take measures to fix the condition.

Meanwhile, the tracker body 110 may further include an alarm portion 118 such as a buzzer which generates an alarm sound externally as shown in FIG. 4.

When the control portion 115 determines that the tracker body 110 is separated from the bracket 120, 220, or 320 on the basis of the information detected from the magnetic force sensor 116a, the alarm portion 118 may generate an alarm sound by driving the control portion 115.

Accordingly, when the tracker body 110 is separated from the bracket 120, 220, or 320 to steal or wrongly use the item 10, the alarm portion 118 may generate an alarm sound to surroundings thereof. Accordingly, the item location tracking device 100, 200, or 300 according to one embodiment of the present invention may preclude attempts to forcibly separate the tracker body 110 from the bracket 120, 220, or 320.

As described above, the tracker body 110 may be coupled to the bracket 120, 220, or 320 in a state in which the bracket 120, 220, or 320 is fixed to the item 10. Accordingly, the tracker body 110 may obtain condition information on the item 10 and surroundings of the item 10 in a state in which the tracker body 110 is fixed to the item 10 and may externally transmit the obtained condition information using the communication module 117.

Accordingly, the user and administrator may administrate the item 10 from a remote location on the basis of the information transmitted from the tracker body 110.

As an example, the tracker body 110 may include a sensing portion 116 including at least one condition sensor configured to detect condition information on the item 10 and surroundings of the item 10 and the communication module 117 configured to externally transmit the information obtained using the sensing portion 116.

Here, the condition information of the item 10 may include one or more of position information of the item, information on whether an external shock is applied to the item, temperature information, humidity information, and atmospheric pressure information of surroundings of the item.

Figure 5:
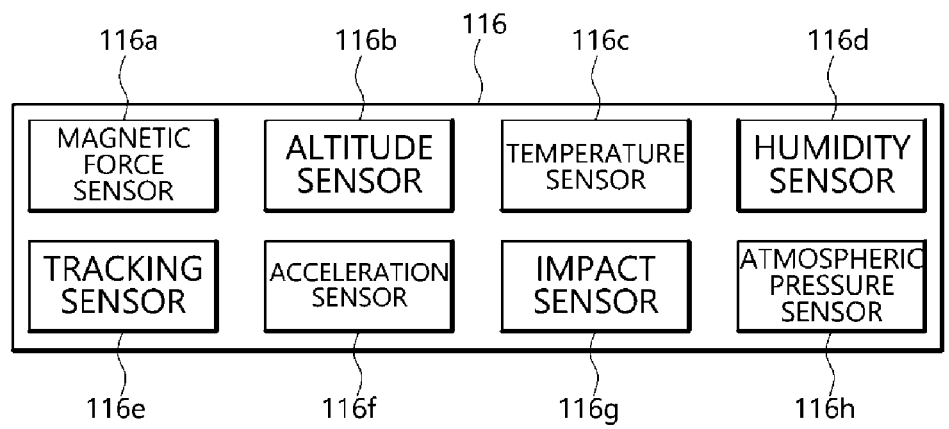
FIG. 5 is a block diagram illustrating detailed components of a sensing portion of FIG. 4.

As a nonrestrictive example, as shown in FIG. 5, the condition sensor may include one or more of an altitude sensor 116b, a temperature sensor 116c, a humidity sensor 116d, a tracking sensor 116e, an acceleration sensor 116f, an impact sensor 116g, and an atmospheric pressure sensor 116h. That is, the sensing portion 116 may include sensors configured to obtain a variety of pieces of information on the item 10 and surroundings of the item 10 and the magnetic force sensor 116a.

Here, the tracker body 110 may be detachably coupled to the bracket 120, 220, or 320. As an example, the tracker body 110 may be fastened to the insertion space S2 of the bracket 120, 220, or 320 using a press-fitting method or may be fastened to the insertion space S2 of the bracket 120, 220, or 320 using a screw-coupling method.

As an example, the tracker body 110 may include a lower cover 111 which has an accommodation space S1 with an open top and is detachably coupled to the bracket 120, 220, or 320, an upper cover 114 which covers the open top of the lower cover 111, and the control portion 115 configured to control overall operations. At least one circuit board 112 and a battery 113 configured to supply power may be disposed in the accommodation space S1.

Here, on the at least one circuit board 112, the sensors 116a, 116b, 116c, 116d, 116e, 116f, 116g, and 116h included in the sensing portion 116 and the communication module 117 configured to externally transmit the information obtained by the sensing portion 116 may be mounted.

In addition, a chip set such as a micro controller unit (MCU) included in the control portion 115 may be mounted on at least one surface of the circuit board 112 and a memory portion 119 configured to store the information obtained by the sensing portion 116 may also be mounted on at least one surface of the circuit board 112.

Accordingly, the sensing portion 116 may obtain a variety of pieces of information on the item 10 and surroundings of the item, and information on whether the tracker body 110 is separated from the bracket 120, 220, or 320 by driving the control portion 115. Also, the communication module 117 may externally transmit the information obtained by the sensing portion 116, and the memory portion 119 may store the information obtained by the sensing portion 116.

Meanwhile, the control portion 115 may sense whether the tracker body 110 is coupled to the bracket 120, 220, or 320 and when the control portion 115 determines that the tracker body 110 is coupled to the bracket 120, 220, or 320, power may be supplied from the battery 113 to the tracker body 110.

Accordingly, the control portion 115 may turn on/off driving of the tracker body 110 by allowing or blocking power supply depending on whether the tracker body 110 is coupled to or separated from the bracket 120, 220, or 320.

As an example, when a magnetic force of the permanent magnet 130 at a certain level or higher is sensed by the magnetic force sensor 116a, the control portion 115 may determine that the tracker body 110 is coupled to the bracket 120, 220, or 320 and supply the power of the battery 113 to the tracker body 110.

As a detailed example, the magnetic force sensor 116a may be a well-known Hall sensor. Accordingly, the control portion 115 may determine whether the tracker body 110 is coupled to the bracket 120, 220, or 320 on the basis of a variation of a voltage value at the Hall sensor caused by the magnetic field generated by the permanent magnet 130.

Accordingly, when it is determined that the tracker body 110 is coupled to the bracket 120, 220, or 320, the control portion 115 may supply power from the battery 113 to the tracker body 110.

However, the type of the magnetic force sensor 116a is not limited thereto, and any device capable of performing a function of a switch on the basis of the magnetic field generated by the permanent magnet 130 is applicable without restrictions.

Meanwhile, the upper cover 114 may include at least one vent hole 114a formed to communicate with the accommodation space S1. The vent hole 114a may allow outside air to flow into the accommodation space S1 so that the temperature sensor 116c or the humidity sensor 116d, which is mounted on the circuit board 112, may be easily operated.

In addition, the upper cover 114 may include an indicator hole 114b formed in an exposed surface of the upper cover 114. Here, an indicator light emitting diode (LED) 140 may be disposed below the upper cover 114 at a position corresponding to the indicator hole 114b. When the power is supplied to the tracker body 110, the indicator LED 140 may emit light. Accordingly, the user or administrator may easily identify whether the tracker body 110 is turned on/off by checking whether the indicator LED 140 emits light through the indicator hole 114b. Here, the LED 140 may be mounted on one surface of the circuit board 112.

The bracket 120, 220, or 320 may be fixedly installed on one side of the item 10 to be controlled as described above. The bracket 120 or 220 may be fixedly installed on the item 10 and then embedded in the item 10 to be prevented from being easily separated from the item 10 or be fixedly installed on the one side of the item 10 to be prevented from being easily separated from the item 10.

Figure 6:
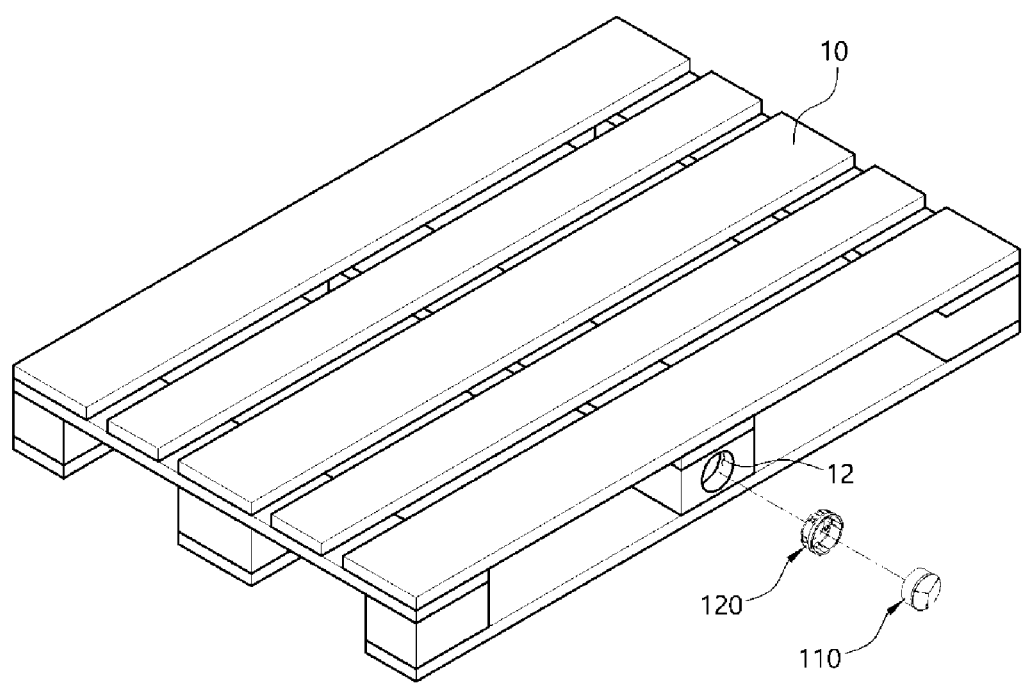
FIG. 6 is a usage state view of the item location tracking device of FIG. 1.

As an example, as shown in FIG. 6, a mounting hole 12 which is inserted inward may be formed in one side of the item 10, and the bracket 120 may be mounted in the mounting hole 12 so that an entire height or length thereof is completely accommodated in the mounting hole 12. Here, the item 10 may be a pallet but is not limited thereto, and any carriable or portable item is applicable without restrictions.

Figure 3:
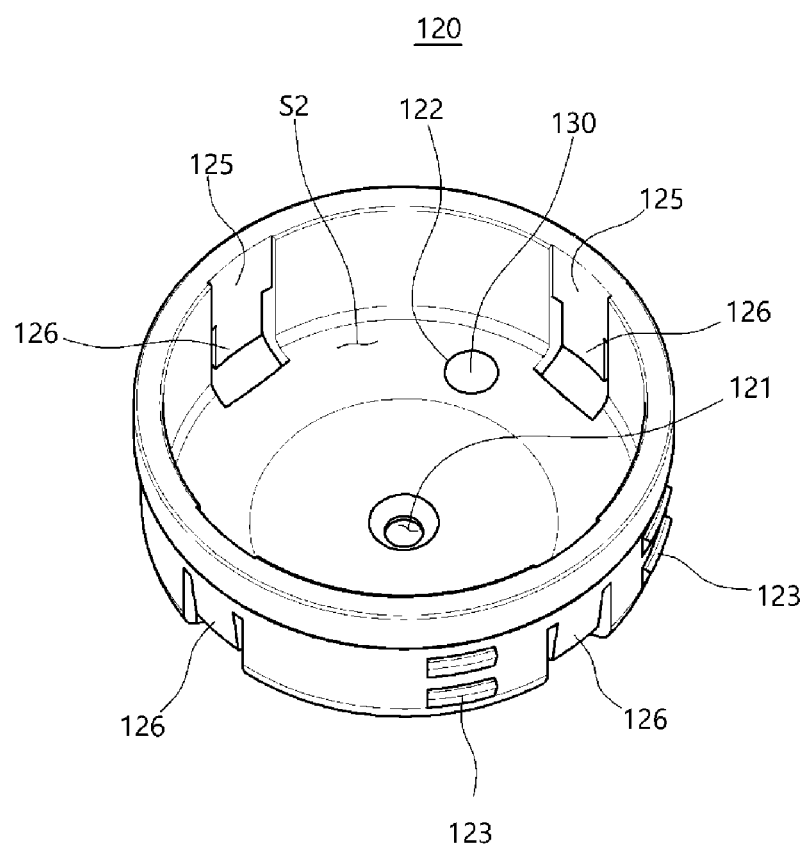
FIG. 3 is a view illustrating a bracket of FIG. 1 when viewed from above.

Here, the bracket 120 may be inserted into the mounting hole 12 using a press-fitting method. In this case, as shown in FIGS. 1 to 3, the bracket 120 may include at least one protruding portion 123 formed on an outer surface to protrude outward therefrom. Accordingly, when the bracket 120 is press-fitted into the mounting hole 12, the protruding portion 123 may remain in a state of being completely pressed against an inner surface of the mounting hole 12. Accordingly, the bracket 120 may be prevented, by the protruding portion 123, from being easily separated or withdrawn from the mounting hole 12.

As an alternative, the bracket 220 may be mounted in the mounting hole 12 of item 10 shown in FIG. 6 using a screw-coupling method. To this end, as shown in FIGS. 7 to 9, a screw portion 124 may be formed on an outer surface of the bracket 220 and a screw portion corresponding to the screw portion 124 formed on the outer surface of the bracket 220 may be formed on the inner surface of the mounting hole 12.

As another alternative, the bracket 320 may be fixedly installed on the one side of the item 10 through a fixing member such as a bolt member. That is, as shown in FIGS. 10 and 11, the bracket 320 may include a plate-shaped fixing plate 321 having a certain area and a hollow body 322 formed on the fixing plate 321 to protrude at a certain height, and the insertion space S2 may be a hollow part of the body 322.

Accordingly, in the item location tracking device 300 having the anti-theft function according to the embodiment, the fixing plate 321 may be fixedly installed on the one side of the item 10 through a fixing member. Accordingly, the bracket 320 may be fixed to the one surface of the item 10, and the tracker body 110 may be fastened to the insertion space S2 formed in the body 322.

Meanwhile, the bracket 120, 220, or 320 may include an accommodation portion 122 configured to accommodate the permanent magnet 130.

As an example, as shown in FIGS. 2, 3, and 11, the accommodation portion 122 may be formed as a mounting groove recessed from a bottom surface of the bracket 120 at a certain depth or formed as a mounting groove recessed from a bottom surface of the body 322 at a certain depth. The mounting groove may have a size corresponding to that of the permanent magnet 130.

As an alternative, as shown in FIG. 9(*a*), the accommodation portion 122 may be formed by a guide portion formed to protrude from a bottom surface of the bracket 220 and the guide portion may be in a form of supporting an edge of the permanent magnet 130.

Meanwhile, the bracket 120 or 220 may include at least one fastening hole 121 formed to pass through a bottom surface of the insertion space S2. An additional fixing member such as a screw member, a pin, a nail, or the like may be fastened to the fastening hole 121 side. Accordingly, the bracket 120 or 220 may be refixed while being inserted in the mounting hole 12 through the fastening hole 121 using a fixing member.

Accordingly, in the item location tracking device 100 or 200 according to one embodiment of the present invention, it may be very difficult to withdraw the bracket 120 or 220 mounted in the mounting hole 12.

Accordingly, even when forcibly removing an entirety of the item location tracking device 100 or 200 from the mounting hole 12 is attempted, a state in which the bracket 120 or 220 is mounted in the mounting hole 12 may be maintained through the fixing member so as to further reduce a risk of the item location tracking device 100 or 200 being stolen or lost.

Even when the tracker body 110 is separated from the bracket 120 or 220, the bracket 120 or 220 may remain in a state of being mounted in the mounting hole 12 so as to sense a separate state between the tracker body 110 and the bracket 120 or 220 using the magnetic force sensor 116a. Accordingly, as described above, it is possible to reduce a risk of a theft case by releasing an alarm sound through the alarm portion 118 in addition to transmitting the separation information between the tracker body 110 and the bracket 120 or 220 through the communication module 117.

Meanwhile, in the item location tracking device 100, 200, or 300 according to one embodiment of the present invention, the tracker body 110 may be fastened to the bracket 120, 220, or 320 to be difficult to separate. That is, the tracker body 110 may have a size approximately similar to that of the insertion space S2 of the bracket 120, 220, or 320.

Accordingly, in the item location tracking device 100, 200, or 300 according to one embodiment of the present invention, when the tracker body 110 is fastened to the bracket 120, 220, or 320, it is possible to prevent the tracker body 110 from being separated from the bracket 120, 220, or 320.

Accordingly, in the item location tracking device 100, 200, or 300 according to one embodiment of the present invention, since the tracker body 110 is prevented from being separated from the bracket 120, 220, or 320 in a state in which the tracker body 110 is fastened to the bracket 120, 220, or 320, it is possible to prevent the tracker body 110 from being stolen.

In this case, the tracker body 110 may be easily separated from the bracket 120, 220, or 320 using an exclusive separation tool 500.

That is, in the item location tracking device 100, 200, or 300 according to one embodiment of the present invention, it is possible to easily separate the tracker body 110 from the bracket 120, 220, or 320 only when the exclusive separation tool 500 is used.

To this end, as shown in FIGS. 2, 8, and 11, the bracket 120, 220, or 320 may include a plurality of guide grooves 125 formed to be recessed from an inner surface thereof along a height direction to allow the exclusive separation tool 500 to enter. The tracker body 110 may include a holding groove 111a formed to be recessed along a circumferential direction to allow one side of the exclusive separation tool 500 to be held.

As an example, the holding groove 111a may be formed in the lower cover 111 side of the tracker body 110 to be recessed along a circumferential direction.

When the tracker body 110 is separated from the bracket 120, 220, or 320, a bent piece 522 of the exclusive separation tool 500 which will be described below may be fastened to the holding grooves 111a.

Figure 16:
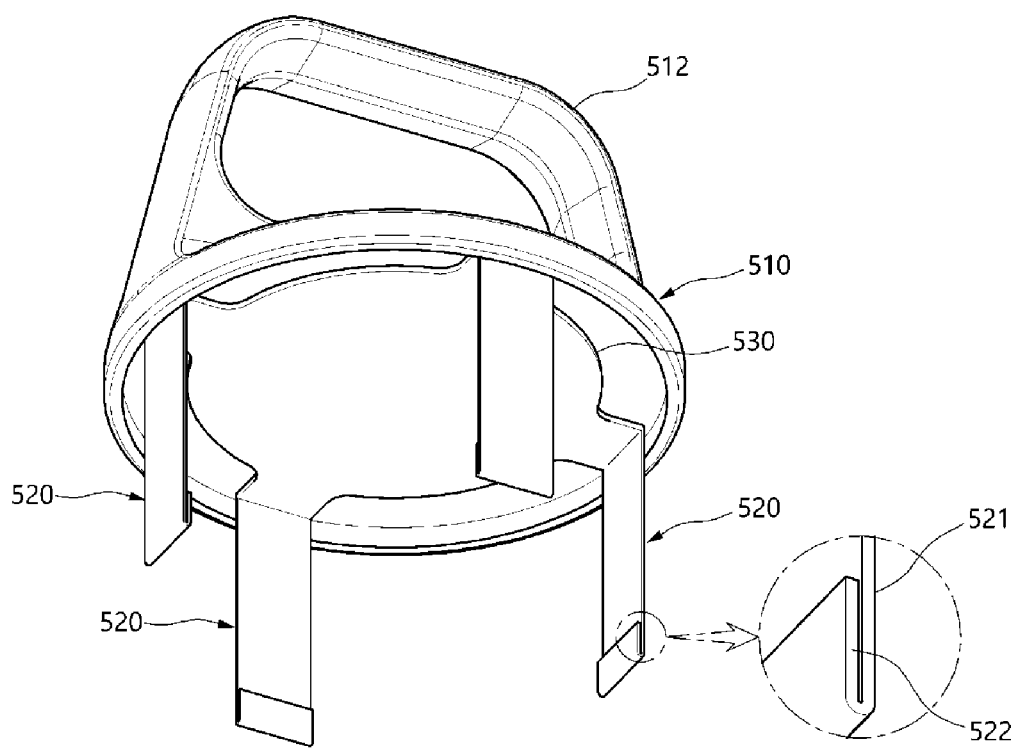
FIG. 16 is a view illustrating an exclusive separation tool which is usable for separating a tracker body from a bracket in the item location tracking device having the anti-theft function according to the present invention.
Figure 17:
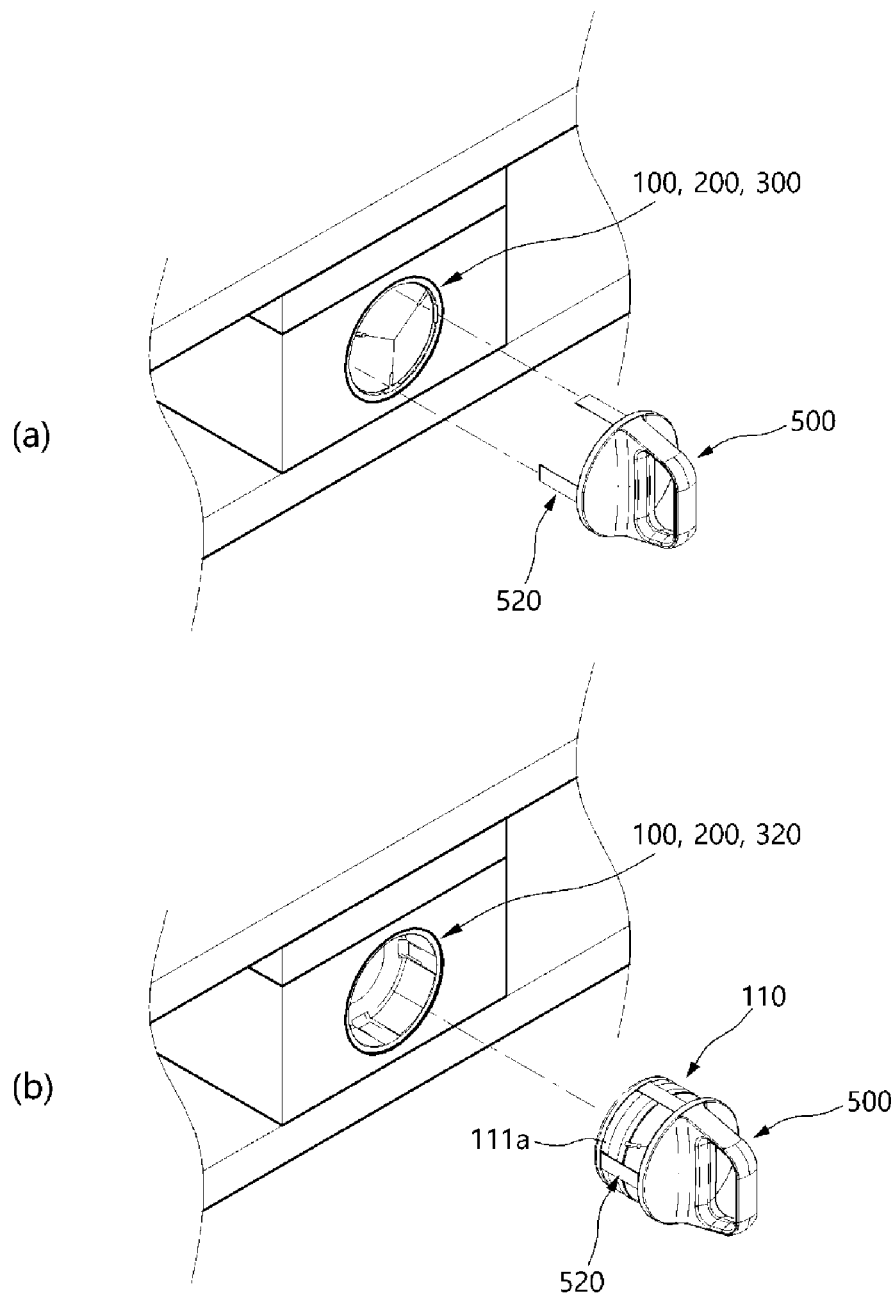
FIG. 17(a) and FIG. 17(b) depict exemplified views illustrating a process of separating the tracker body from the bracket using the exclusive separation tool of FIG. 16.
Figure 18:
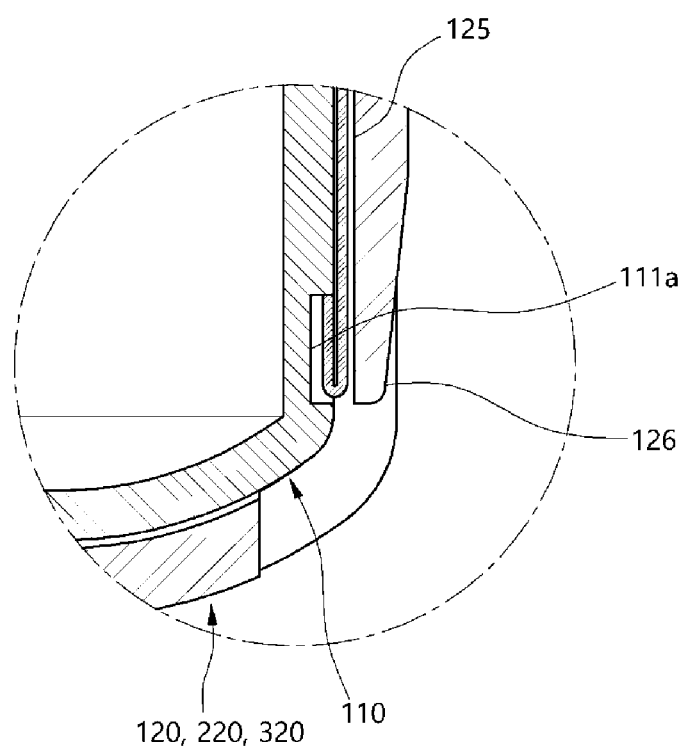
FIG. 18 is a partial cross-sectional view illustrating a state in which the exclusive separation tool enters the bracket in FIG. 17(a) and FIG. 17(b)

That is, as shown in FIG. 16, the bent piece 522 of the exclusive separation tool 500 may move toward a lower part of the insertion space S2 along the guide grooves 125 formed in the bracket 120, 220, or 320 in a state in which the tracker body 110 is fastened to the bracket 120, 220, or 320. The bent piece 522 which has moved to the lower part of the insertion space S2 along the guide grooves 125 may be mounted in the holding groove 111a.

Accordingly, when the exclusive separation tool 500 is pulled to allow the bent piece 522 to be withdrawn from the insertion space S2, the tracker body 110 may be easily separated from the bracket 120, 220, or 320 by applying an external force through the bent piece 522 mounted in the holding groove 111a.

Here, at least a portion of each of the plurality of guide grooves 125 may be formed to be cut so as to allow the bent piece 522, which enters along the guide grooves 125, to easily enter.

Accordingly, when the bent piece 522 enters along the guide groove 125 of the insertion space S2, a cut part 126 of the guide groove 125 may be elastically deformed by a pressure applied from the bent piece 522.

Accordingly, the bent piece 522 may easily enter along the guide groove 125 of the insertion space S2 and be fastened to the holding groove 111a when reaching a position corresponding to the holding groove 111a.

Meanwhile, the exclusive separation tool 500 may include the bent piece 522 which enters along the guide grooves 125 as described above.

As an example, as shown in FIG. 16, the exclusive separation tool 500 may include a body portion 510 and a plurality of leg portions 520, and the bent piece 522 may be formed on the leg portion 520 side.

Here, the body portion 510 may include a handle portion 512 formed to be easily gripped by the user. The plurality of leg portions 520 may be formed to protrude from one surface of the body portion 510 to a certain length.

As a nonrestrictive example, the plurality of leg portions 520 may protrude from a connection plate 530 having a certain area and the connection plate 530 and the plurality of leg portions 520 may be integrally formed. In this case, the connection plate 530 may be fixedly installed on one surface of the body portion 510.

Also, the plurality of leg portions 520 may each include a longitudinal portion 521 extending from the connection plate 530 and the bent piece 522 bent from an end of the longitudinal portion 521 in a direction which overlaps with the longitudinal portion 521.

The plurality of leg portions 520 may be inserted into a gap formed between the tracker body 110 and the inner surface of the bracket 120, 220, or 320 which face each other in a state in which the tracker body 110 is fastened to the insertion space S2 of the bracket 120, 220, or 320, and the end side including the bent piece 522 may enter along the guide grooves 125 formed in the bracket 120, 220, or 320.

Accordingly, in the guide groove 125, even when the end side of the leg portion 520 including the bent piece 522 does not enter easily, the cut part 126 may elastically retract due to coming into contact with the end side of the leg portion 520 so as to secure a space into which the end side of the leg portion 520 including the bent piece 522 may enter.

Accordingly, the bent piece 522 may be easily fastened to the holding groove 111a of the tracker body 110. In this state, when the exclusive separation tool 500 is pulled using the handle portion 512, the tracker body 110 may be withdrawn outward in a state in which the bent piece 522 is fastened to the holding groove 111a. Accordingly, the tracker body 110 may be separated from the bracket 120, 220, or 320.

Accordingly, in the item location tracking device 100, 200, or 300 according to one embodiment of the present invention, even when the tracker body 110 is mounted so as not to be easily separated from the bracket 120, 220, or 320, the tracker body 110 may be simply separated from the bracket 120, 220, or 320 using the exclusive separation tool 500.

Accordingly, in the item location tracking device 100, 200, or 300 according to one embodiment of the present invention, since the tracker body 110 is easily separable from the bracket 120, 220, or 320 using the exclusive separation tool 500, it is possible to simply replace the battery 113 accommodated in the accommodation space S1 or to easily remove the tracker body 110 from the bracket 120, 220, or 320 when transportation of the item 10 is completed.

The plurality of leg portions 520 are shown as protruding from the connection plate 530 to a certain length in one direction in the drawing but are not limited thereto and may be formed to directly protrude from the body portion 510.

Meanwhile, an item location tracking device 400 having an anti-theft function according to one embodiment of the present invention may fundamentally prevent the tracker body 110 from being separated from a bracket 420 by changing a shape of the bracket 420.

Figure 12:
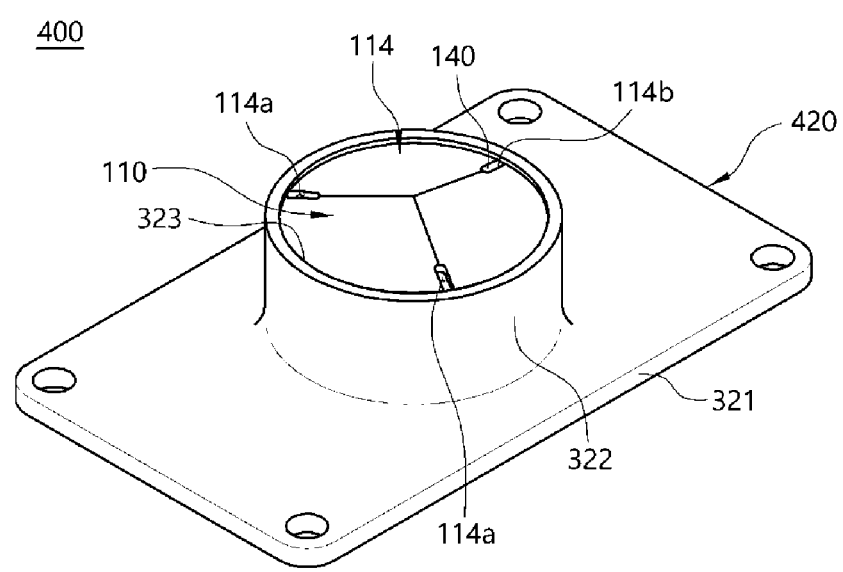
FIG. 12 is a schematic diagram of an item location tracking device having an anti-theft function according to yet another embodiment of the present invention.
Figure 13:
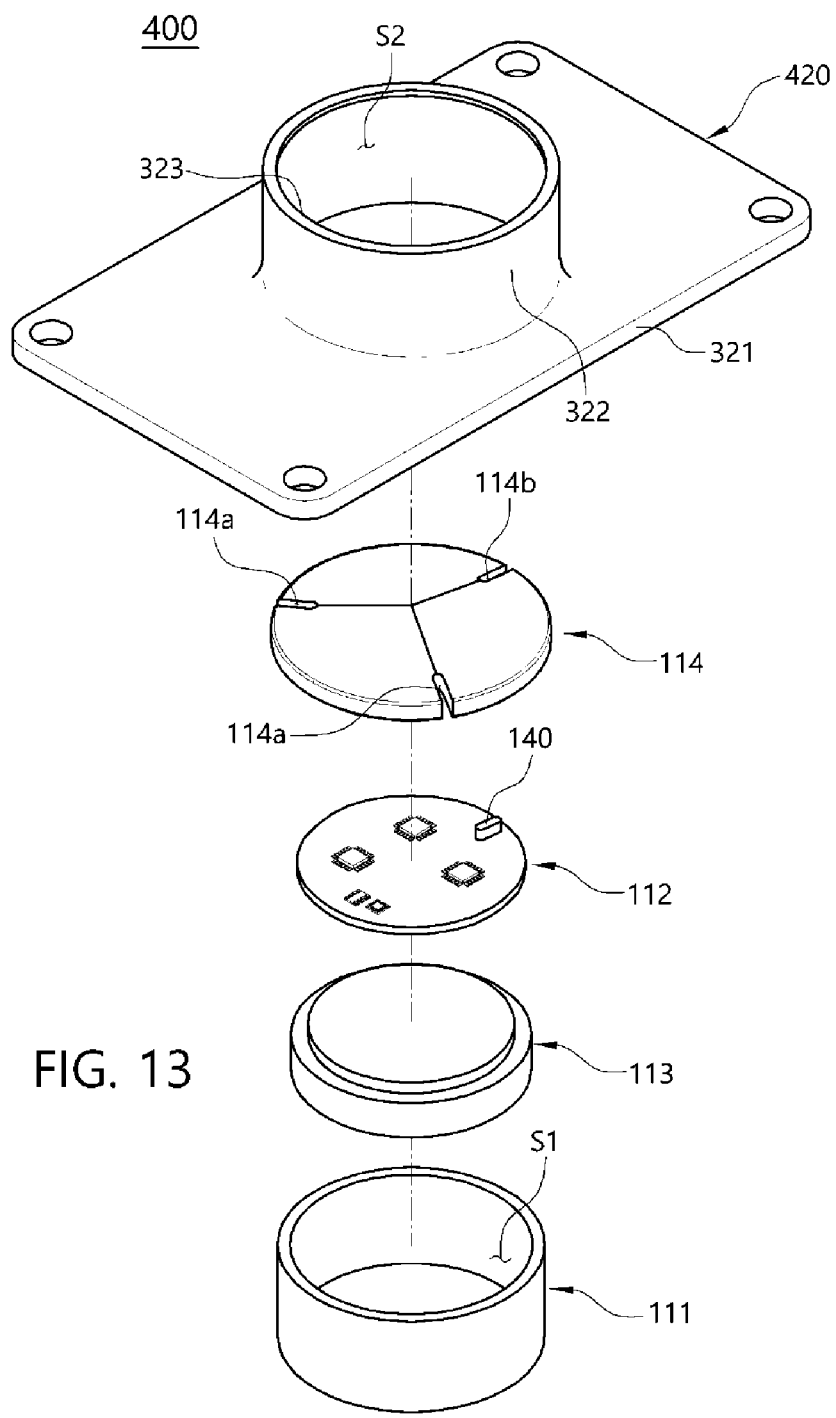
FIG. 13 is an exploded view of the item location tracking device of FIG. 12.
Figure 14:
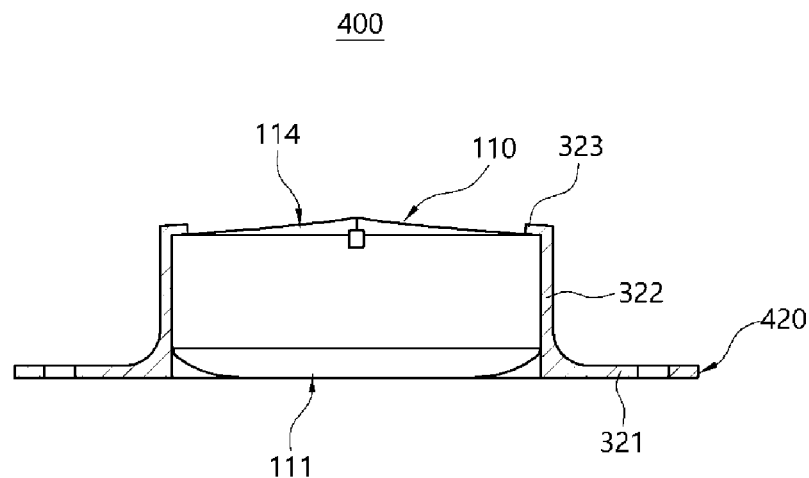
FIG. 14 is a cross-sectional view illustrating a partially cut bracket of FIG. 12.

In detail, as shown in FIGS. 12 to 14, the bracket 420 may include a plate-shaped fixing plate 321 having a certain area and a hollow body 322 formed on the fixing plate 321 to protrude at a certain height and have open top and bottom, and a hollow part of the body 322 may be the insertion space S2 configured to accommodate the tracker body 110.

Figure 15:
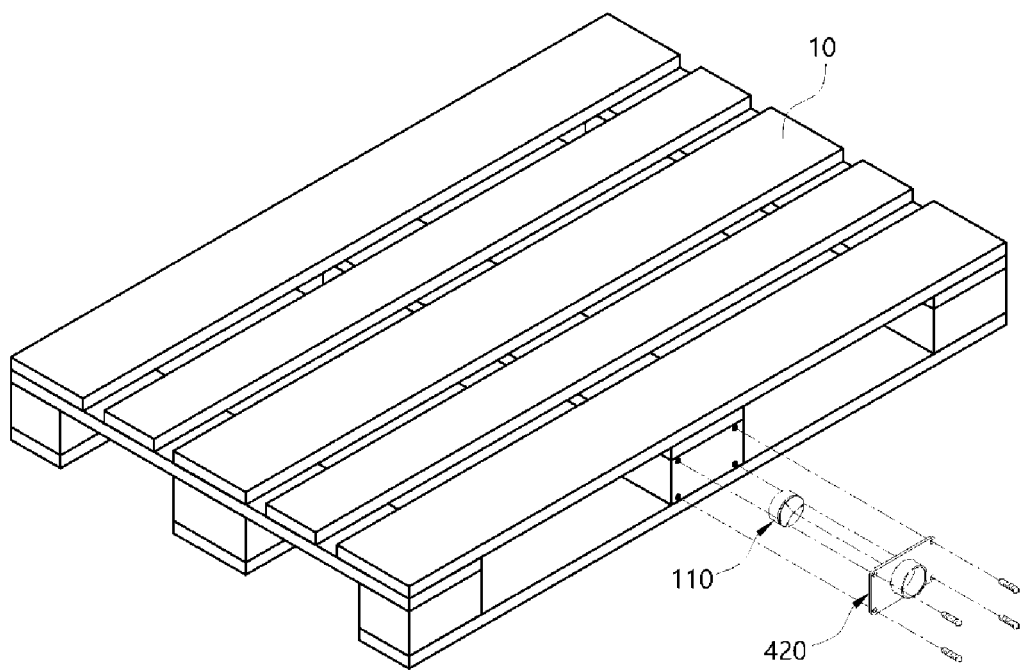
FIG. 15 is a usage state view of the item location tracking device of FIG. 12.

Here, the bracket 420 may include a restriction portion 323 formed to protrude inward along an upper edge of the body 322 as shown in FIG. 13, and the fixing plate 321 may be fixedly installed on one side of the item 10 through a fixing member such as a bolt member as shown in FIG. 15.

Accordingly, in the item location tracking device 400 having the anti-theft function according to the embodiment, when the tracker body 110 is inserted into the insertion space S2 of the body 332 and the fixing plate 321 is fixed to one surface of the item 10, a bottom surface of the tracker body 110 may be disposed to face the one surface of the item 10. Also, the upper edge side of the tracker body 110 accommodated in the insertion space S2 may be restricted by the restriction portion 323.

Accordingly, the tracker body 110 may be physically prevented from being separated from the insertion space S2 of the body 322 by the restriction portion 323.

In the embodiment, like the above-described embodiment, the tracker body 110 may include all of the lower cover 111, the circuit board 112, the battery 113, the upper cover 114, the control portion 115, the sensing portion 116, the communication module 117, the alarm portion 118, and the memory portion 119. Detailed functions and operations are equal to those of the above-described embodiments and a detailed description thereof will be omitted.

Also, in the embodiment like the above-described embodiment, the magnetic force sensor 116a and the permanent magnet 130 may be provided on the tracker body 110 and the bracket 420 side. However, since it is very difficult to physically separate only the tracker body 110 from the bracket 420 while being mounted on the item 10, the magnetic force sensor 116a and the permanent magnet 130 may be omitted.

Meanwhile, the item location tracking device 100, 200, 300, or 400 may include a tracker body 210 having a different form.

Figure 19:
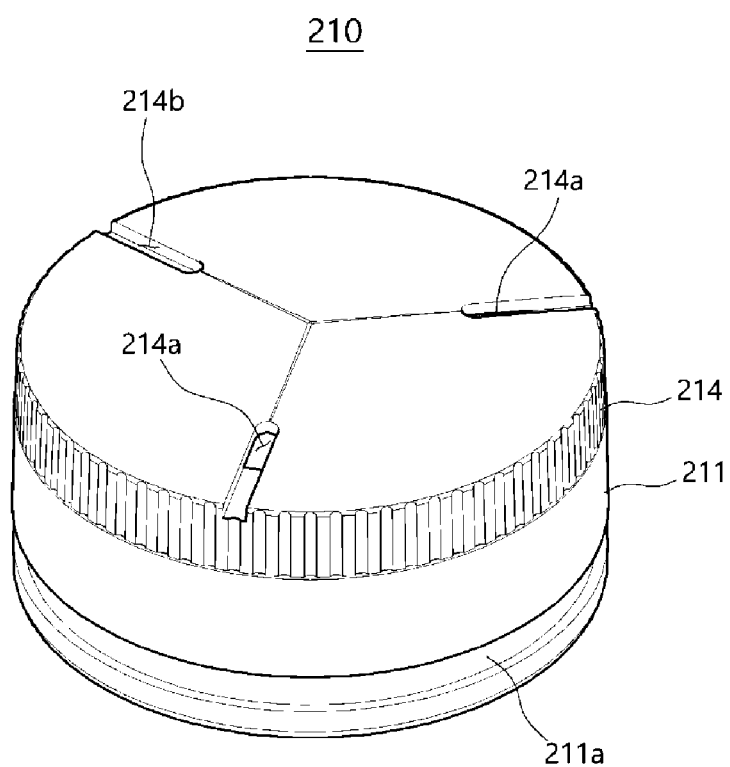
FIG. 19 is a view illustrating another example of the tracker body applicable to the item location tracking device having the anti-theft function according to one embodiment of the present invention.
Figure 20:
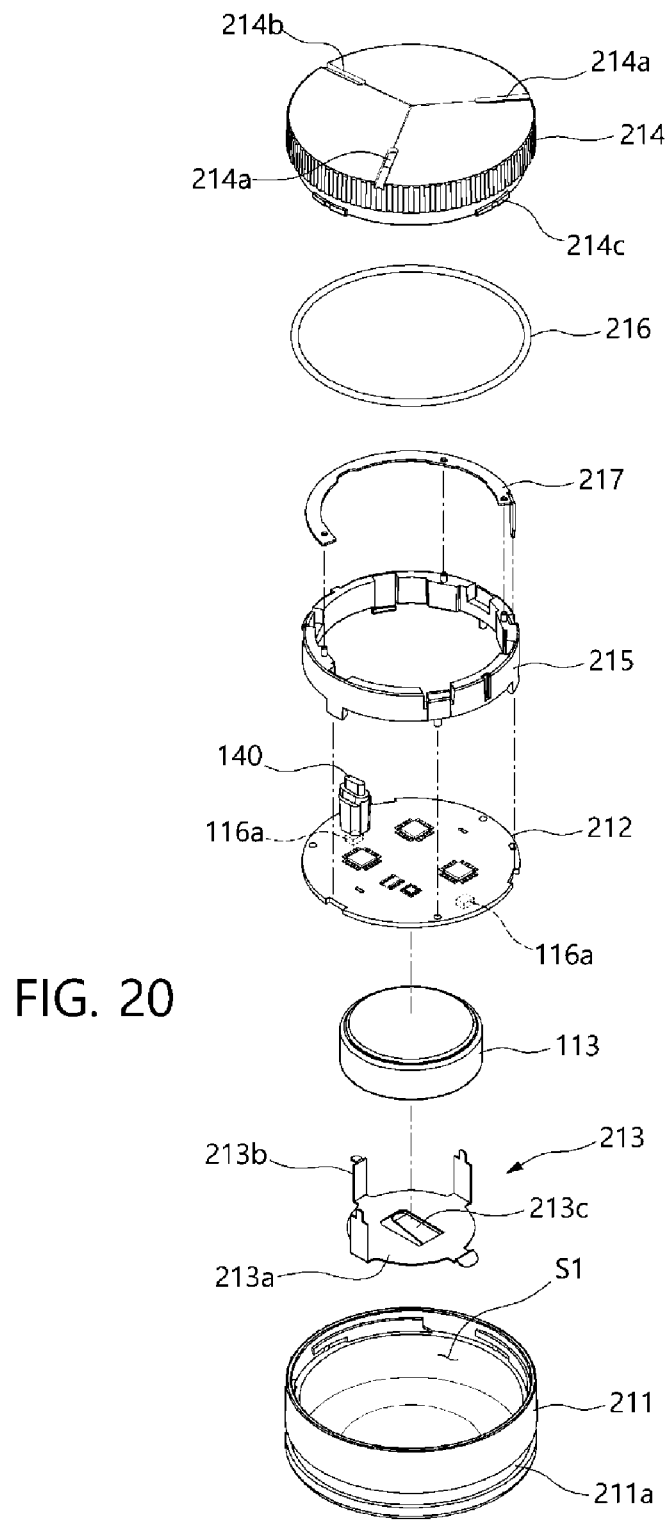
FIG. 20 is an exploded view of the item location tracking device of FIG. 19.

That is, in the item location tracking device 100, 200, 300, or 400 according to one embodiment of the present invention, the tracker body 110 shown in FIGS. 1 to 3 and 7 to 15 may be replaced with the tracker body 210 shown in FIGS. 19 and 20.

In detail, the tracker body 210 may include a lower cover 211 which has an accommodation space S1 with an open top and is detachably coupled to the bracket 120, 220, 320, or 420 and an upper cover 214 which covers the open top of the lower cover 211. Also, at least one circuit board 212 and the battery 113 configured to supply power may be disposed in the accommodation space S1.

Also, the tracker body 210 may include the control portion 115, the sensing portion 116, and the communication module 117, which are equal to those of the tracker body 110. As an example, the tracker body 210 of the embodiment may employ the components shown in FIGS. 4 and 5.

That is, on the at least one circuit board 212, the sensors 116a, 116b, 116c, 116d, 116e, 116f, 116g, and 116h included in the sensing portion 116 and the communication module 117 configured to externally transmit the information obtained by the sensing portion 116 may be mounted.

In addition, a chip set such as an MCU included in the control portion 115 may be mounted on at least one surface of the circuit board 212 and the memory portion 119 configured to store the information obtained by the sensing portion 116 may be mounted on at least one surface of the circuit board 212.

Here, the information obtained using the sensing portion 116 may include one or more of position information of an item, information on whether an external shock is applied to the item, temperature information, humidity information, and atmospheric pressure information of surroundings of the item, and information on whether the tracker body 210 is separated from the bracket 120, 220, 320, or 420.

Accordingly, the sensing portion 116 may obtain a variety of pieces of information on the item 10 and surroundings of the item, and information on whether the tracker body 210 is separated from the bracket 120, 220, 320, or 420 by driving the control portion 115. Also, the communication module 117 may externally transmit the information obtained by the sensing portion 116, and the memory portion 119 may store the information obtained by the sensing portion 116.

In addition, the control portion 115 may sense whether the tracker body 210 is coupled to the bracket 120, 220, or 320 and when it is determined that the tracker body 210 is coupled to the bracket 120, 220, or 320, power may be supplied from the battery 113 to the tracker body 210. A detailed operational relationship thereof is equal to that of the tracker body 110 of the above-described embodiment, and a detailed description thereof will be omitted.

Meanwhile, the upper cover 214 may include at least one vent hole 214a, which are formed to communicate with the accommodation space S1, and indicator hole 214b. The indicator LED 140 may be disposed below the upper cover 214 at a position corresponding to the indicator hole 214b.

In the embodiment, functions and an operational relationship of the vent hole 214a, the indicator hole 214b, and the indicator LED 140 are equal to those of the above-described embodiment, and a detailed description will be omitted.

Here, the tracker body 210 according to the embodiment may further include a terminal member 213 and a holder member 215.

The terminal member 213 and the holder member 215 may be disposed in the accommodation space S1. The terminal member 213 may be disposed below the circuit board 212, and the holder member 215 may be disposed above the circuit board 212.

Figure 21:
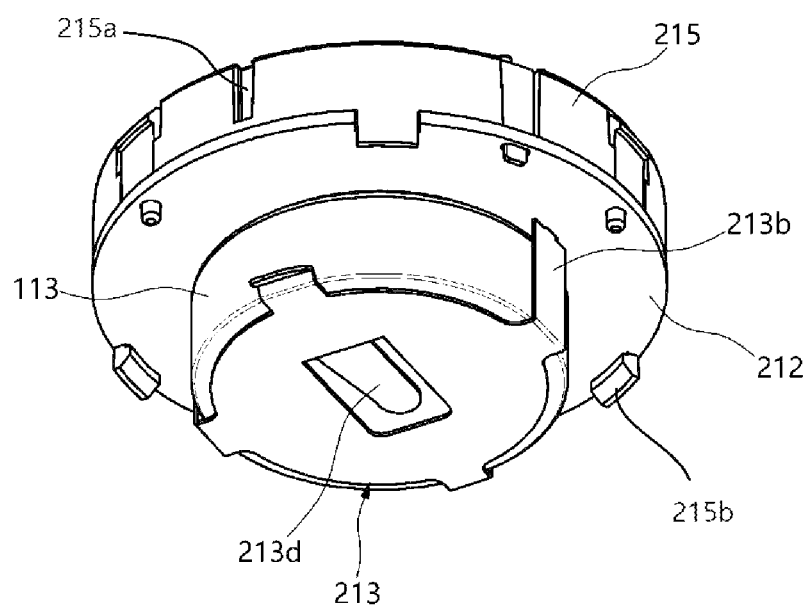
FIG. 21 is a view illustrating a state in which a terminal portion, a battery, and a circuit board are coupled in FIG. 19 when viewed from below.

Also, as shown in FIG. 21, one sides of the terminal member 213 and the holder member 215 may be fastened to the circuit board 212, and the battery 113 may be disposed between the terminal member 213 and the circuit board 212 so that one surface thereof comes into contact with the terminal member 213.

Here, the terminal member 213 may electrically connect the battery 113 to the circuit board 212, and the holder member 215 may fix the upper cover 214.

In detail, the terminal member 213 may include a plate-shaped support plate 213a having a certain area and a plurality of height portions 213b protruding from the support plate 213a to a certain height. The battery 113 may be disposed in a space formed by the plurality of height portions 213b and the support plate 213a.

Here, the support plate 213a may include an elastic piece 213c to easily come into contact with the battery 113. The elastic piece 213c may be formed by cutting a part of the support plate 213a, and one end is integrally connected to the support plate 213a to be elastically deformed.

Accordingly, the battery 113 may always remain in a contact state using the elastic piece 213c.

Also, some of the plurality of height portions 213b may perform a function of being fastened to the circuit board 212, and others may perform a function of being electrically connected to the circuit board 212.

Meanwhile, a lower part of the holder member 215 may be coupled to the circuit board 212, and at least one fastening groove 215a configured to fix the upper cover 214 may be formed in an upper part thereof. As an example, the holder member 215 may be formed to have a hollow and may be coupled to the circuit board 212 using at least one fastening protrusion 215b formed in a lower edge. The at least one fastening groove 215a may be formed in an upper edge side.

In this case, as shown in FIG. 20, the upper cover 214 may include at least one fastening protrusion 214c protruding outward along a circumferential direction.

Accordingly, the fastening protrusion 214c of the upper cover 214 may be inserted into the fastening groove 215a formed in the holder member 215.

Accordingly, the upper cover 214 may cover the open top of the lower cover 211 and be fixed to the holder member 215.

Meanwhile, like the above-described tracker body 110, the tracker body 210 according to the embodiment may include a holding groove 211a to be separated from the bracket 120, 220, or 320 using the above-described exclusive separation tool 500. As an example, the holding groove 211a may be formed along a circumferential surface of the lower cover 211.

The holding groove 211a has the same function and operational relationship as those of the holding groove 111a of the above-described embodiment, and a detailed description will be omitted.

In FIG. 20, undescribed reference numeral 216 may refer to a sealing member such as an O-ring for airtightness, and reference numeral 217 may refer to an antenna included in the above-described communication module 117.

The above-described item location tracking device 100, 200, 300, or 400 is employable in a variety of fields which require anti-theft and detachment alarm notification and may construct a safe and reliable item remote control system.

Also, the item location tracking device 100, 200, 300, or 400 may monitor an item's own conditions of being used using various sensors included in the tracker body 110 or 210 and prevent illegal re-use thereof.

In addition, in the above-described embodiment, the item location tracking device 100, 200, or 300 shown in FIGS. 1 to 3 and 7 to 15 has been described as including the magnetic force sensor 116a and the permanent magnet 130 but is not limited thereto. Also, the item location tracking device 100, 200, or 300 may exclude the magnetic force sensor 116a and the permanent magnet 130.

Although one embodiment of the present invention has been described above, the concept of the present invention is not limited to the embodiment disclosed herein and it should be understood that one of ordinary skill in the art who understands the concept of the present invention may easily provide other embodiments through addition, changes, removal, and the like of components without departing from the scope of the same concept which will be included in the scope of the concept of the present invention.

The invention claimed is:

1. An item location tracking device having an anti-theft function, comprising:
   a tracker body comprising a sensing portion including a magnetic force sensor configured to detect a magnetic field and at least one condition sensor configured to detect condition information of an item and a communication module configured to externally transmit information obtained using the sensing portion;
   a housing-shaped bracket which has an insertion space, into which the tracker body is inserted, and is fixedly installed on the item to fix the tracker body to the item; and
   a permanent magnet disposed in the insertion space to provide a magnetic field toward the magnetic force sensor to detect whether the tracker body is separated from the bracket,
   wherein the tracker body further comprises:
      a lower cover which has an accommodation space with an open top and is detachably coupled to the bracket;
      at least one circuit board on which the sensing portion and the communication module are mounted and which is disposed in the accommodation space;
      a battery disposed in the accommodation space and electrically connected to the circuit board;
      an upper cover configured to cover the open top of the lower cover; and
      a control portion configured to control overall operations of the tracker body.

2. The item location tracking device of claim 1, wherein when separation information between the tracker body and the bracket is sensed by the magnetic force sensor, the communication module externally transmits the separation information.

3. The item location tracking device of claim 2, wherein the tracker body further comprises an alarm portion configured to generate an alarm sound when the separation information between the tracker body and the bracket is sensed by the magnetic force sensor.

4. The item location tracking device of claim 1, wherein the condition information of the item includes one or more of position information of the item, information on whether an external shock is applied to the item, and temperature information, humidity information, and atmospheric pressure information of surroundings of the item.

5. The item location tracking device of claim 1, wherein the item includes a mounting hole configured to fasten the bracket,
   wherein the bracket includes at least one protruding portion formed on an outer surface to protrude outward therefrom, and
   wherein the bracket is inserted into and embedded in the mounting hole to be prevented, by the at least one protruding portion, from being externally separated.

6. The item location tracking device of claim 1, wherein the item includes a mounting hole configured to fasten the bracket, and wherein the bracket and the mounting hole are screw-coupled using mutually corresponding screw portions.

7. The item location tracking device of claim 1, wherein the bracket includes a mounting groove configured to accommodate the permanent magnet, and wherein the mounting groove is defined by a guide portion formed to protrude from a bottom surface of the insertion space.

8. The item location tracking device of claim 1, wherein in the bracket, at least one fastening hole for double fixation with the item is formed to pass through a bottom surface of the insertion space.

9. The item location tracking device of claim 1, wherein when a magnetic force of the permanent magnet is sensed by the magnetic force sensor while the tracker body is coupled to the bracket, power is supplied to the tracker body to drive the tracker body.

10. The item location tracking device of claim 1, wherein the bracket includes a plurality of guide grooves formed to be recessed from an inner surface along a height direction to allow an exclusive separation tool to enter.

11. The item location tracking device of claim 10, wherein at least a portion of each of the plurality of guide grooves is cut to be elastically deformed by a pressure generated when the exclusive separation tool enters.

12. The item location tracking device of claim 10, wherein the tracker body includes a holding groove formed to be recessed along a circumferential direction so that one side of the exclusive separation tool is held.

13. An item location tracking device having an anti-theft function, comprising:
    a tracker body comprising a sensing portion including a magnetic force sensor configured to detect a magnetic field and at least one condition sensor configured to detect condition information of an item and a communication module configured to externally transmit information obtained using the sensing portion;
    a housing-shaped bracket which has an insertion space, into which the tracker body is inserted, and is fixedly installed on the item to fix the tracker body to the item; and
    a permanent magnet disposed in the insertion space to provide a magnetic field toward the magnetic force sensor to detect whether the tracker body is separated from the bracket, wherein the bracket includes a plurality of guide grooves formed to be recessed from an inner surface along a height direction to allow an exclusive separation tool to enter.

14. The item location tracking device of claim 13, wherein at least a portion of each of the plurality of guide grooves is cut to be elastically deformed by a pressure generated when the exclusive separation tool enters.

15. The item location tracking device of claim 13, wherein the tracker body includes a holding groove formed to be recessed along a circumferential direction so that one side of the exclusive separation tool is held.

* * * * *